United States Patent
Toyonaga et al.

[11] Patent Number: 5,978,572
[45] Date of Patent: Nov. 2, 1999

[54] LSI WIRE LENGTH ESTIMATION AND AREA ESTIMATION

[75] Inventors: Masahiko Toyonaga, Hyogo; Fumihiro Kimura, Nara; Minako Fukumoto; Noriko Koshita, both of Osaka, all of Japan

[73] Assignee: Matsushita Electric Industrial Co., LTD., Osaka, Japan

[21] Appl. No.: 08/915,723

[22] Filed: Aug. 21, 1997

[30] Foreign Application Priority Data

Aug. 21, 1996 [JP] Japan ................................. 8-219578

[51] Int. Cl.⁶ ..................................... G06F 17/50
[52] U.S. Cl. ................... 395/500.06; 395/500.23
[58] Field of Search ................... 364/488, 490, 364/489, 491; 395/500.05, 500.06, 500.13, 500.23

[56] References Cited

U.S. PATENT DOCUMENTS

| | | | |
|---|---|---|---|
| 5,475,605 | 12/1995 | Lin | 364/488 |
| 5,555,201 | 9/1996 | Dangelo et al. | 364/489 |
| 5,596,505 | 1/1997 | Steinweg et al. | 364/490 |
| 5,629,860 | 5/1997 | Jones et al. | 364/490 |
| 5,774,371 | 6/1998 | Kawakami | 364/491 |

OTHER PUBLICATIONS

C. Sechen, "Average Interconnection Length Estimation for Random and Optimized Placements", Proc of IEEE, pp. 190–193, 1987.

M. Pedram, et al., "Interconnection Length Estimation for Optimized Standard Cell Layouts", Proc of IEEE, pp. 390–393, 1989.

T. Hamada, et al., "A Wire Length Estimation Technique Utilizing Neighborhood Density Equations", 29th ACM/IEEE Design Automation Conference, pp. 57–61, 1992.

Primary Examiner—Kevin J. Teska
Assistant Examiner—Russell W. Frejd
Attorney, Agent, or Firm—McDermott, Will & Emery

[57] ABSTRACT

The wire length of an LSI is estimated from a netlist describing connection information of the LSI and a cell library storing information as to cells used in the LSI design, with performing no rough placement and rough wiring by a layout system. Information necessary for wire length estimation is extracted from the netlist and the cell library. A net basic wire length is determined for each fan-out. In a net wire length estimating step, a net wire length for each fan-out is estimated by making reference to the determined net basic wire length and taking into account net expansion due to the cell distribution in a cell placement. Additionally, taking into account a terminal distribution and the aspect ratio of an estimation-target block, a correction on the estimated net wire length is made. From the corrected net wire length, the total wire length of the estimation-target block is estimated.

9 Claims, 9 Drawing Sheets

| | fn = 1 | fn = 2 | fn = 3 | fn = 4 |
|---|---|---|---|---|
| ACTUAL CELL LAYOUTS |  AREA 2 SEMI-PERIMETER 3 |  AREA 3 SEMI-PERIMETER 4 |  AREA 4 SEMI-PERIMETER 4 |  AREA 5 SEMI-PERIMETER 6 |
| BBOX MODEL |  AREA 2 SEMI-PERIMETER $2\sqrt{2}=2.83$ |  AREA 3 SEMI-PERIMETER $2\sqrt{3}=3.46$ |  AREA 4 SEMI-PERIMETER 4 |  AREA 5 SEMI-PERIMETER $2\sqrt{5}=4.47$ |

| Name | #ofCells | #ofNet | Averagedfn | Ss |
|---|---|---|---|---|
| CircuitA | 1244 | 1673 | 2.02 | 262786 |
| CircuitB | 2786 | 3012 | 2.45 | 576596 |
| CircuitC | 5473 | 5696 | 2.15 | 871194 |
| CircuitD | 7746 | 8447 | 2.22 | 1431461 |

Fig. 11

| Name | #ofCells | Wire length(mm) | | error |
|---|---|---|---|---|
| | | Estimate | Experiment | |
| CircuitA | 1244 | 159113 | 164019 | -3.0% |
| CircuitB | 2786 | 374200 | 332052 | +12.7% |
| CircuitC | 5473 | 687324 | 779177 | -11.8% |
| CircuitD | 7746 | 978956 | 971817 | +0.7% |

Fig. 12

| Name | #ofCells | Area(mm$^2$) | | error |
|---|---|---|---|---|
| | | Estimate | Experiment | |
| CircuitA | 1244 | 286992 | 290532 | -1.2% |
| CircuitB | 2786 | 630295 | 658677 | -4.3% |
| CircuitC | 5473 | 993385 | 985046 | +0.8% |
| CircuitD | 7746 | 1565876 | 1626858 | -3.7% |

Fig. 13

LSI WIRE LENGTH ESTIMATION AND AREA ESTIMATION

BACKGROUND OF THE INVENTION

The present invention relates to a computer-aided LSI design technique. It more specifically pertains to a method for estimating the wire length and area of an actual layout before performing a layout design, with a view to achieving a reduction of the number of LSI design steps.

Recent remarkable developments in technology of reducing the dimensions of LSI have accomplished very large-scale integration which makes it possible to fabricate very large-scale integrated circuits (VLSIs) at the level of millions of gates. Meanwhile, electronic devices, such as multimedia equipment, have been improved in performance as well as in weight. Therefore, technology capable of providing one-chip large-scale integration is in great demand. Various top-down design techniques have been proposed to design and develop high-performance VLSIs. In a top-down design technique, LSI functional specifications are specified by languages and subsequent design steps up to the generation of logical circuits are carried out automatically by computer. The amount of data dealt with in each design step is increased in the order of language design level, logical circuit design level, and layout design level. Therefore, the efficiency of development can be improved as a whole by laying out a design at the level of language.

In conventional LSIs, the wire delay is less than the macrocell delay and the signal delay, which seriously affects circuit timing specifications, is almost determined by macrocell driving performance. Accordingly, it is possible to design LSIs by performing logical synthesis with the aid of an automatic synthesis system (e.g., Design Analyzer manufactured by Synopsys) having the function to take into account timing specifications.

However, as the dimensions and integration of LSI is improved, the ratio of the wire delay to the circuit delay increases. In performing a logical synthesis process according to top-down design technology, it becomes necessary to take into account a wire delay that has been ignored. That is, both the wire resistance and the capacitance between wires relatively increase with respect to the transistor drive performance, and performing a design without taking wire delay into account will give rise to an inconvenient circumstance that it becomes necessary to repeat a logic synthesis process after a layout design is completed. This produces a bar to improvements in the design efficiency.

As can be seen from the above, it is necessary to take into account layout results, particularly wire length and layout area, in a logical synthesis process. For this reason, there have been strong demands for a fast and accurate estimating method for estimating layout results.

Typical techniques of estimating layout results are shown below.

(a) A layout result estimation is formed by layout result statistical processing.
(b) A layout result estimation is formed by actually performing either rough placement or rough wiring.
(c) A layout result estimation is formed from circuit characteristics on the basis of a netlist.

In the method (a), it is impossible to reflect the versatility of circuit and, as a result, wire length estimation, inclusive of redundancy containing circuit variations, is required. It becomes difficult to lay out an optimal design both in the aspect of area and in the aspect of performance. In the method (b), either a rough placement process or a rough wiring process is carried out, which makes it possible to obtain an estimated result corresponding to circuit characteristic. However, the method (b) is a very time-consuming technique. A considerable reduction of the design period may not be expected.

The remaining method (c) has the ability to improve the efficiency of design. Various techniques, based on the number of cell instances and the number of nets as to a netlist, have been proposed.

C. Sechen shows, in "Average Interconnection Length Estimation for Random And Optimized Placements," In Proc. of ICCAD, pp. 190–193, 1988, an estimating method. In this estimating method, a checkerboard model, in which square cells having an average area are laid out in 2-D square grid form, is used in order to estimate the length of wiring when net terminals are distributed in random manner by means of combinational computing. Massoud Pedram and Bryan Preas show, in "Interconnection Length Estimation for Optimized Standard Cell Layout," In Proc. of ICCAD, pp. 390–393, 1989, a method for forming an estimation of the length of wiring by finding a distribution of terminals within a multi-terminaled bounding box.

Takeo Hamada and others show, in "A Wire Length Estimation Technique Utilizing Neighborhood Density Equations." In Proc. of 32nd Design Automation Conference, pp. 402–407, 1995, a method for forming an estimation of the length of wiring by expressing the neighborhood relationship of cells belonging in a netlist with neighborhood density equations.

SUMMARY OF THE INVENTION

We, taking into account the foregoing prior art techniques, paid attention to the net fan-out with reference to past layout results in order to consider the expansion of placement elements and the branch of wiring which are important factors in the aspect of automatic placement technology.

Figure 13:
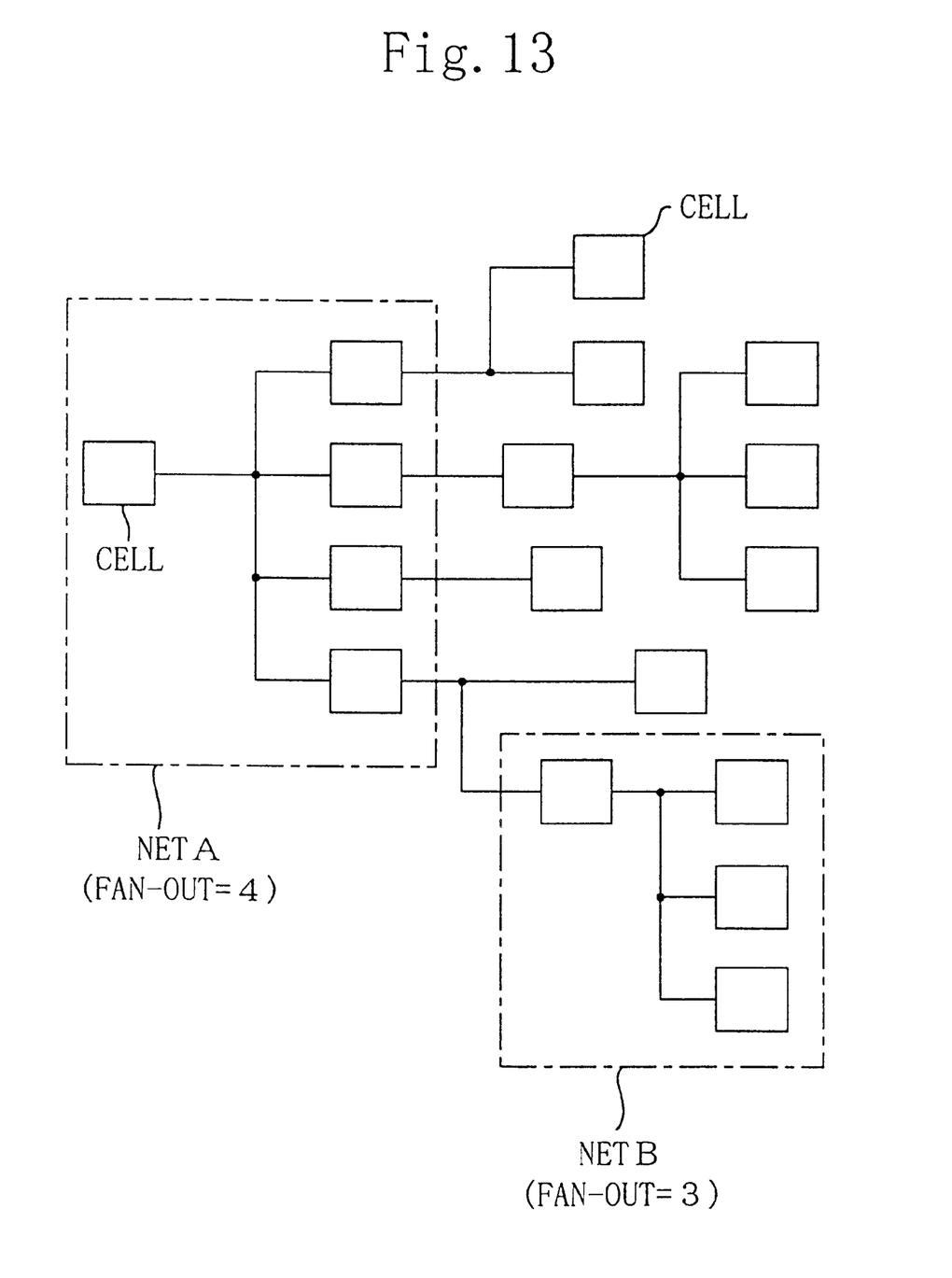
FIG. 13 is a diagram showing a cell connection relationship described by a netlist and shows the relationship between cell, net, and fan-out.

FIG. 13 is a diagram showing a cell interconnection relationship described in a netlist and illustrates the relationship between cell, net and fan-out. A net, which is the netlist minimum unit, has information about terminals belonging in the net and cells having the terminals. Here, the fan-out of a net results from subtracting one from the number of terminals of a net. In FIG. 13, the net A has a fan-out of 4 and the net B has a fan-out of 3.

Paying attention to the fan-out makes it possible to classify nets contained in a netlist. If the wire length of a net for each fan-out can be estimated at high accuracy, then the total wire length can be estimated at high accuracy by finding a sum of the estimated wire lengths.

The previously described prior art techniques are all for two-layer wiring layout. However, in high-performance design multilayer wiring layout is employed, which, of course, requires an estimating method for multilayer wiring layout.

It is therefore an object of the present invention to provide an improved method for estimating an LSI wire length without performing rough placement and wiring processes. The present invention achieves a fast, high-accuracy LSI wire length estimating method. The present invention further provides an improved method for estimating a layout area at high accuracy in performing a multilayer wiring layout.

The present invention provides a method of estimating the wire length of a large-scale integrated circuit (LSI) from a netlist describing connection information of said LSI and a cell library storing information as to cells used in the LSI design, said method comprising:

(a) an information extracting step of extracting, from said netllst and said cell library, information including the total number of nets, the number of nets for each fan-out, and the types and areas of cells belonging in each net, for an estimation-target block in said LSI;

(b) a basic wire length determining step of determining, based on said information extracted in said information extracting step, a net basic wire length for each fan-out as a reference to wire length estimation; and (c) a net wire length estimating step of estimating, based on said information extracted in said information extracting step, a net wire length for each fan-out by making reference to said net basic wire length for said fan-out determined in said basic wire length determining step and taking into account net expansion due to the distribution of cells in a cell placement;

wherein the total wire length of said estimation-target block is estimated based on said estimated net wire lengths.

In accordance with the wire length estimating method of the present invention, a basic wire length for each fan-out is determined to be a reference to wire length estimation. The wire length of each net is estimated by making reference to the net basic wire length and taking into account a net expansion due to variation in the cell placement. Which makes it possible to estimate the wire length of a net for each fan-out. As a result of such arrangement, the total wire length of a block which is a target of estimation may be estimated at high accuracy by finding a sum of the net wire lengths. Additionally, there is no need for performing combinational arithmetic operations which are required in the prior art techniques. Accordingly, estimation can be completed in a short time for the case of LSI's having a great number of cells.

In the wire length estimating method, it is preferred that said basic wire length determining step includes obtaining the average area of cells belonging in all nets having each fan-out and determining a net basic wire length for each fan-out based on the half-perimeter of a square having an area equivalent to the product of said obtained cell average area for said fan-out and the number of cells belonging in a net having said fan-out.

In the wire length estimating method, it is preferred that said basic wire length determining step includes obtaining the average area of all cells belonging in said estimation-target block and determining a net basic wire length for each fan-out based on the half-perimeter of a square having an area equivalent to the product of said obtained cell average area of said estimation-target block and the number of cells belonging in a net having said fan-out.

In the wire length estimating method, it is preferred that said net wire length estimating step includes obtaining the expansion ratio of a net having said fan-out from the sum of the areas of all cells belonging in said estimation-target block and the sum of the areas of cells belonging in all nets having said fan-out and estimating a net wire length for said fan-out using said obtained net expansion ratio.

In the wire length estimating method, it is preferred that said net wire length estimating step includes correcting a net wire length by making use of a correction formula expressing a wire length increment due to the distribution of cell terminals with a geometric series.

In the wire length estimating method, it is preferred that said net wire length estimating step includes correcting a net wire length by taking into account a variation in wire length according to the aspect ratio of said estimation-target block.

The present invention provides a method of estimating the area of a large-scale integrated circuit (LSI) from a netlist describing connection information of said LSI and a cell library storing information as to cells used in the LSI design, said method comprising:

(a) a wire length estimating step of estimating the wire length of an estimation-target block in said LSI;

(b) a wiring area estimating step of estimating, from said wire length estimated in said wire length estimating step, a wiring area of a layout occupied by wires; and (c) a layout area estimating step of estimating, from said wiring area found in said wiring area estimating step and the total cell area and over-the-cell wiring utilization area of said estimation-target block, the layout area of said estimation-target block;

wherein said layout area estimating step determines said total cell area to be the layout area of said estimation-target block when said wiring area is smaller than said over-the-cell wiring utilization area and obtains, when said wiring area is greater than said over-the-cell wiring utilization area, said estimation-target block's layout area from a difference between said wiring area and said over-the-cell wiring utilization area and from said total cell area In accordance with the area estimating method of the present invention, layout area estimation is carried out on the assumption that over-the-cell regions are available as wiring regain for the case of multilayer wiring. This makes it possible to form an estimation of the layout area in designing a multilayer wiring layout.

In the LSI area estimating method, it is preferred that said wire length estimating step including:

(a) an information extracting step of extracting, from said netlist and said cell library, information including the total number of nets, the number of nets for each fan-out, and the types and areas of cells belonging in each net, for said estimation-target block;

(b) a basic wire length determining step of determining, based on said information extracted in said information extracting step, a basic wire length for each fan-out as a reference to wire length estimation; and (c) a net wire length estimating step of estimating, based on said information extracted in said information extracting step, a net wire length for each fan-out by making reference to said net basic wire length for said fan-out determined in said basic wire length determining step and taking into account net expansion due to the distribution of cells in a cell placement;

wherein the total wire length of said estimation-target block is estimated based on said estimated net wire lengths.

In the LSI area estimating method, it is preferred that said net wire length estimating step includes obtaining the expansion ratio of a net having said fan-out from the sum of the areas of all cells belonging in said estimation-target block and the sum of the areas of cells belonging in all nets having said fan-out and estimating a net wire length for said fan-out using said obtained net expansion ratio.

BRIEF DESCRIPTION OF THE DRAWINGS

FIG. 2, comprised of FIG. 2(a) and FIG. 2(b), shows a bounding box (BBOX) model.

FIG. 6, comprised of FIG. 6(a) and FIG. 6(b), is a diagram schematically showing the relationship between the distribution of terminals and the distance between terminals, wherein

FIG. 7, comprised of FIG. 7(a) and FIG. 7(b), is a diagram showing the structure of a benchmark circuit having a fixed fan-out for easily determining a wire length adjustment parameter, wherein

FIG. 8. comprised of FIG. 8(a) and FIG. 8(b), is a diagram showing a BBOX whose aspect ratio varies with the block aspect ratio, wherein

DETAILED DESCRIPTION OF THE INVENTION FIRST EMBODIMENT

Figure 1:
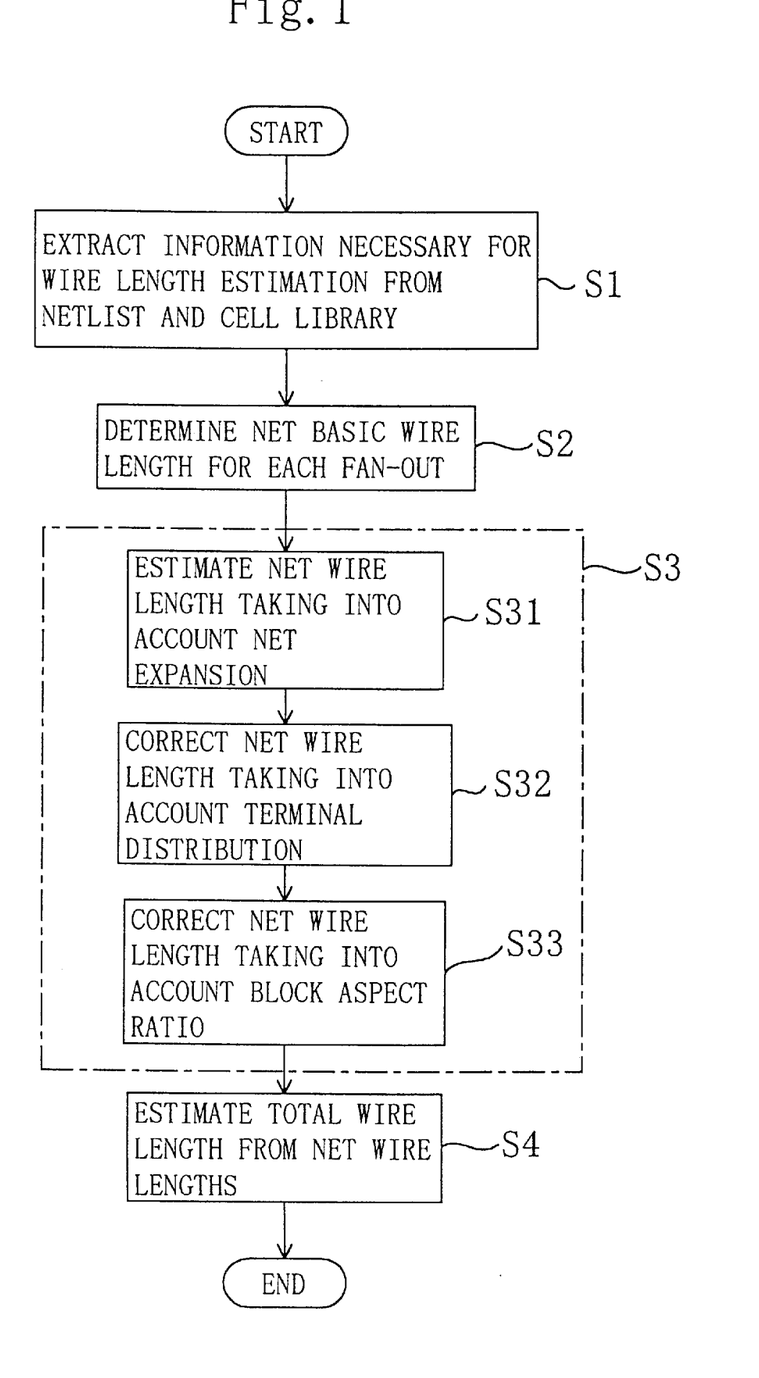
FIG. 1 is a flowchart showing the successive steps in a wire length estimating method in accordance with a first embodiment of the present invention.

Referring first to FIG. 1, the steps in a wire length estimating method for LSI in accordance with a first embodiment of the invention are flowcharted. As shown in FIG. 1, the present wire length estimating method includes four steps, namely, the information extracting step S1, the basic wire length determining step S2, the net wire length estimating step S3, and the step S4. In the information extracting step S1, information necessary for wire length estimation is extracted out of a netlist and a cell library. In the basic length determining step S2, the basic wire length of each of nets is determined, by fan-outs. In the net wire length estimating step S3, a net wire length for each fan-out is estimated by making reference to a basic wire length determined in the basic length determining step 2. In the step 4, an estimation of the total wire length of a block of an LSI which is a target of estimation is formed from the estimated net wire lengths. The net wire length estimating step S3 includes three sub-steps, the steps S31, S32, and S33. In the step S31, a net wire length is estimated taking a net expansion into account. In the step S32, net wire length correction is carried out taking a distribution of terminals into account. In the step S33, net wire length correction is carried out taking the aspect ratio of an estimation-target block into account.

In accordance with the wire length estimating method of the present invention, an estimation of the wire length of an LSI is formed from a netlist describing connections information of the LSI as well as from information stored in a cell library that stores information concerning cells used in the design of the LSI, without rough placement and wiring by a layout system. Each step is described below in detail.

INFORMATION EXTRACTING STEP S1

In the information extracting step S1, a given net list and a cell library are analyzed to extract information necessary for performing a wire length estimation process such as information about the total number of nets, the number of nets for each fan-out, and the types and areas of cells contained in each net, for an estimation-target block.

BASIC WIRE LENGTH DETERMINING STEP S2

In the basic wire length determining step S2, a net basic wire length, which serves as a reference to wire length estimation, is determined for each fan-out.

In the present wire length estimating method, neither a placement process nor a wiring process is carried out. Accordingly, it is impossible to know in what manner cells and terminals are laid out. For this reason, it becomes necessary to modelize both a placement of cells and a placement of terminals in order to find a basic wire length. Meanwhile, placement algorithms used in the conventional layout systems have a tendency to provide a placement in which both the area of layout and the length of wiring are minimized. Additionally, in a commonly-used placement algorithm, it is said that the wire length is minimized when the block aspect ratio (i.e., the ratio of width to height) is 1.

Accordingly, in the present invention net basic wire lengths are determined by making utilization of an idea of a bounding box model (hereinafter called "BBOX model") which is employed for wire length estimation in a placement improving step of the layout design.

Figure 2A:
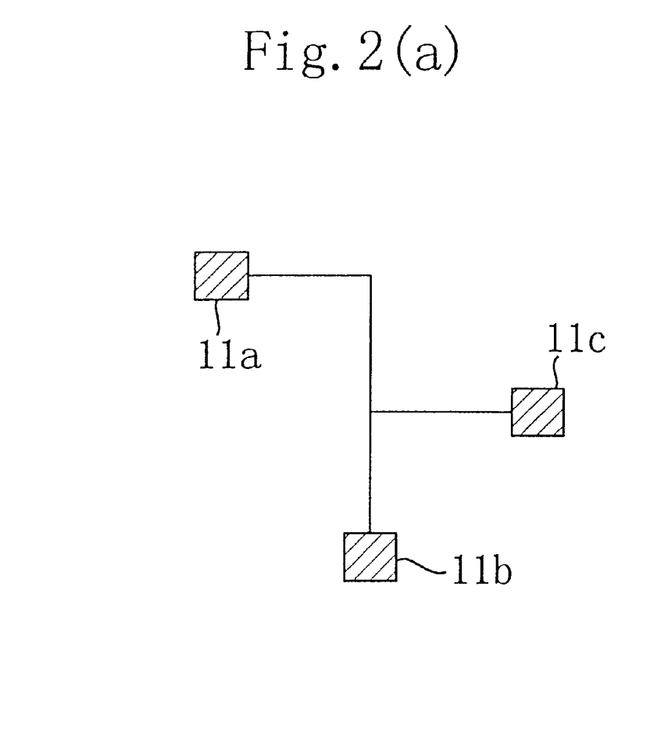
Figure 2B:
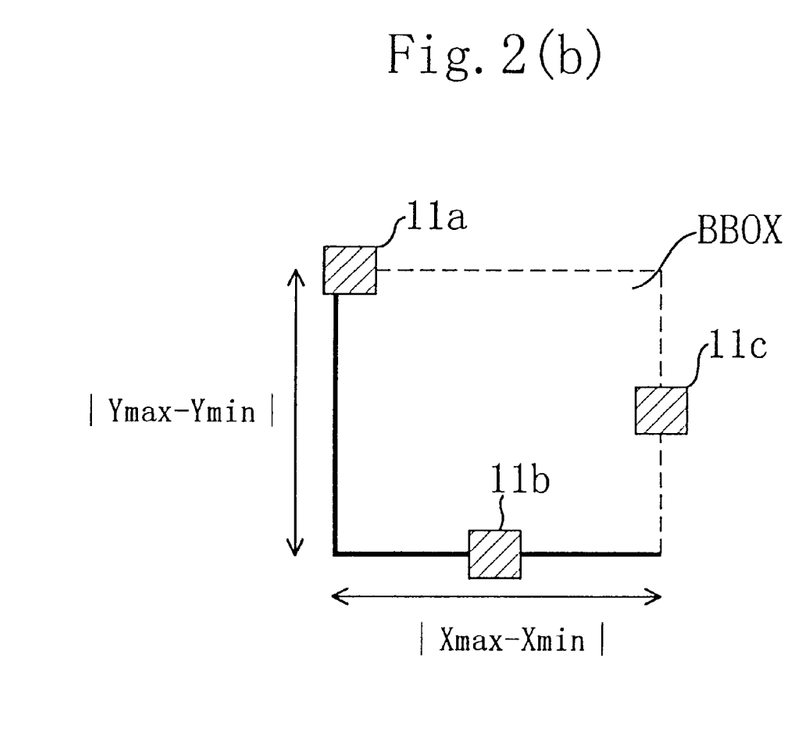

Referring now to FIG. 2, a BBOX model is now explained. The maximum and minimum values of the X- and Y-coordlnates of cell terminals placed according to a netlist are obtained. Suppose that a rectangle, formed by the vertexes of four points at which the X-coordinate or the Y-coordinate reaches the maximum value or the minimum value, is a BBOX, and a wiring process is carried out taking the shortest route in the BBOX. The half-perimeter of the BBOX serves as the approximate value of a wire length. For example, when cell terminals 11a, 11b, and 11c are placed as shown in FIG. 2, an assumed BBOX looks like the one as shown in FIG. 2(b), and the wire length (WL) is given by the following formula:

$$WL = |Xmax - Xmin| + |Ymax - Ymin|. \quad (1)$$

where Xmax is the X-coordinate's maximum value, Xmin is the X-coordinate's minimum value, Ymax is the Y-coordinate's maximum value, and Ymin is the Y-coordinate's minimum value.

Figure 3:
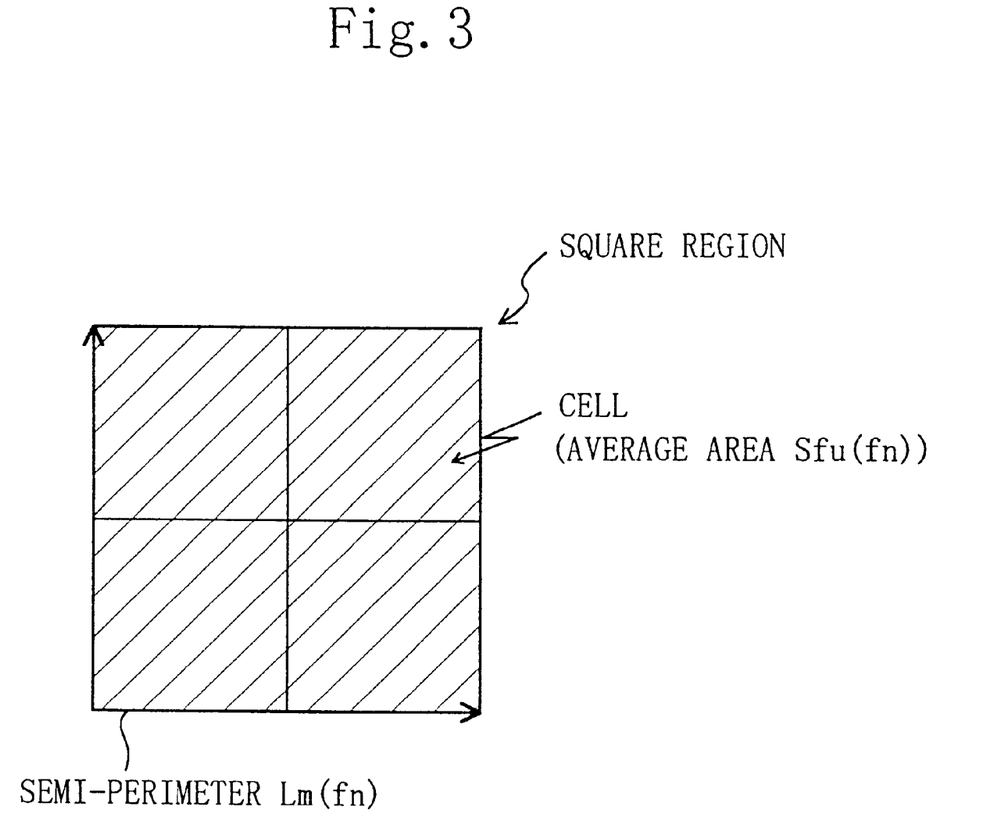
FIG. 3 is a diagram of an assumed example of the BBOX in the basic wire length determining step S2 of the wire length estimating method of the first embodiment of the present invention and shows a BBOX about a net having a fan-out of 3.

FIG. 3 is a diagram showing an example of the assumed BBOX model of the basic wire length determining step S2. FIG. 3 shows a BBOX model about a net having a fan-out of 3. In the basic wire length determining step S3, it is supposed that (fn+1) cells belonging in a net having a fan-out of fn are closely placed in a square region whose area is equivalent to a sum of the areas of the (fn+1) cells, and that all terminals of the cells exist in the square region. For example, as shown in FIG. 3, four cells belonging in a net having a fan-out of 3 are placed within a square region whose area is equivalent to a sum of the areas of these four cells. Such a square region is equivalent to the minimum range of the placement region of cells in a net having each fan-out. This square region is used as a BBOX for a net having a fan-out of fn, and a net basic wire length, which serves as a reference to wire length estimation, is approximated by the half-perimeter of the BBOX.

More specifically, the basic wire length of a net having a fan-out of fn, Lm(fn), is obtained using the following formula.

$$Lm(fn)=2\{Sfu(fn)\cdot(fn+1)\}^{1/2} \qquad (2)$$

Note here that Sfu(fn) is the average cell area of a net having a fan-out of fn. The average area of cells belonging in all nets having each fan-out is obtained. Based on the half-perimeter of a square whose area is equivalent to a product of multiplying the found average cell area and the number of cells in the net, the basic wire length of the net is determined.

Figure 4:
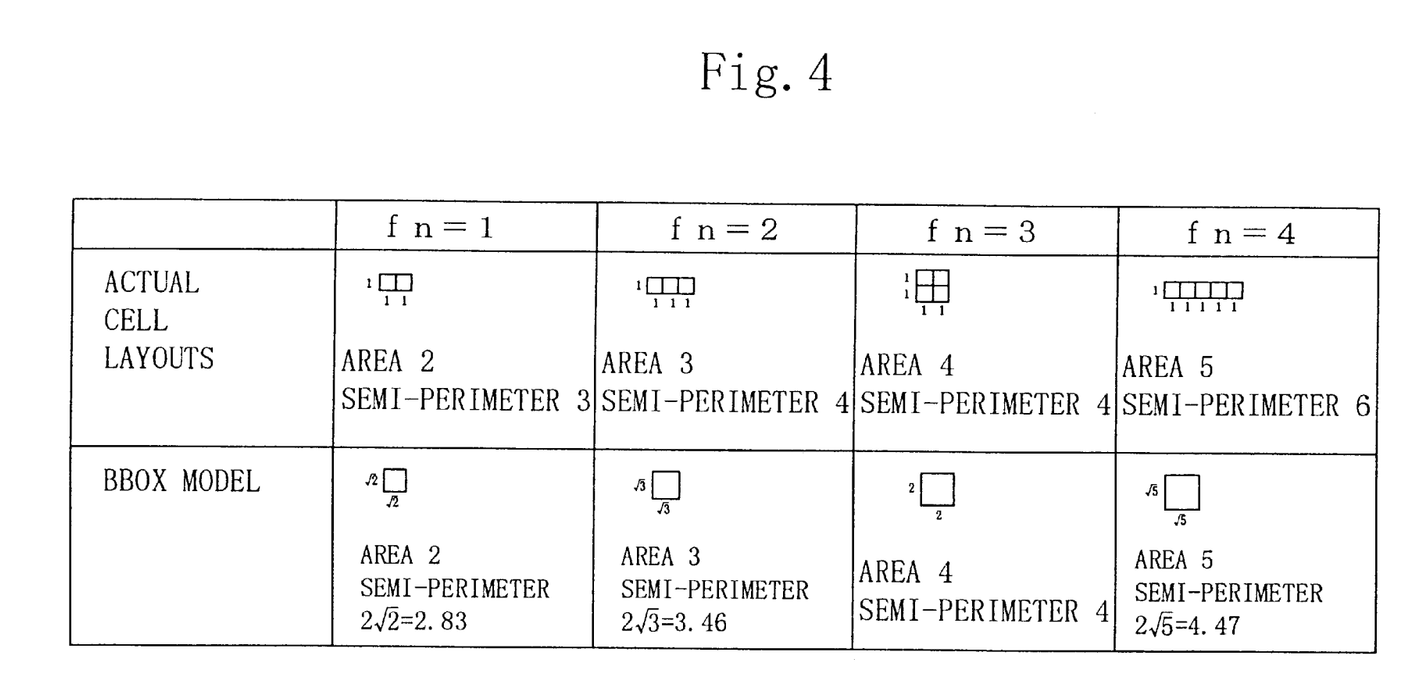
FIG. 4 is a diagram comparing an actual cell layout and a model of the first embodiment of the present invention.

Because of such a BBOX, the net basic wire length becomes a lowest wire length. FIG. 4 is a diagram for comparison of an actual layout with a model of the present embodiment. As shown in FIG. 4, when taking a net having a fan-out of 2 as an example, the minimum value of the half-perimeter is 4 in the actual cell layout while the minimum value is further reduced down to $2\sqrt{3}$ in the model in accordance with the present embodiment.

The use of such a model makes it possible to select a lowest wire length when all ideal conditions are met, as a basic wire length. This ensures that a wire length estimated will not fall below the basic wire length. Accordingly, in the following steps, it is sufficient to estimate how far an estimated wire length exceeds a basic wire length. Wire expansion is modelized to reflect a basic wire length, which forms an accurate estimation of the wire length. Further, such modelization becomes easy to carry out.

In the formula (2), Sfu(fu), i.e., the average cell area of a net having a fan-out of fn, is used. Instead, the average area of all cells belonging in an estimation-target block, Su, may be employed. At this time, the basic wire length of a net having a fan-out of fn, i.e., Lm(fn), can be given by the following formula.

$$Lm(fn)=2\{Su\cdot(fn+1)\}^{1/2} \qquad (3)$$

More specifically, the average area of all cells belonging in an estimation-target block is found. With respect to each of the nets having each fan-out, based on the half-perimeter of a square whose area is equivalent to a product of multiplying the found average cell area and the number of cells of the net, a basic wire length for the net is determined.

NET WIRE LENGTH ESTIMATING STEP S3

In the net wire length estimating step S3, the wire length of each of the nets having each fan-out is estimated by making reference to the basic wire length determined in the basic wire length determining step S2 and taking into account a net expansion due to variation in the cell placement.

STEP S31

If there exists only one net in ideal condition, there may be the possibility that all cells are closely placed within a square region used in the basic wire length determining step's S2 model and the wire length may be minimized. However, a netlist contains therein a mixture of nets having different fan-outs and a placement of cells of one net is actually determined by the correlation between the one net and another net, as a result of which the placement region will expand beyond a minimum placement model of FIG. 3 due to variations in the cell placement. Additionally, in the model of the basic wire length determining step S2, cell form is not taken into account and cells are placed in a square region whose area is equivalent to a sum of the areas of the cells, regardless of the number of cells belonging in a net. However, as can be seen from FIG. 4, it is almost impossible for cells to be placed closely in a square region similar to the model, for the cells are in different forms.

In order of forming an estimation of the wire length in consideration of net expansion due to variations in the cell placement, a wire length is found by multiplying a basic wire length and a expansion ratio taking into account the density of net.

Figure 5:
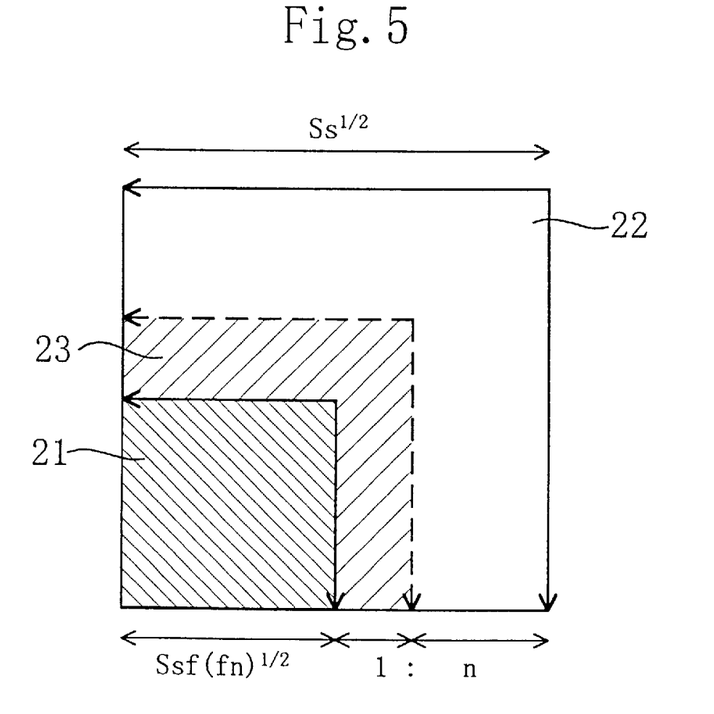
FIG. 5 is a diagram of a model used to determine an expansion ratio in the net wire length estimating step S3 of the wire length estimating method of the first embodiment of the present invention.

FIG. 5 is a diagram showing a model for determining an expansion ratio. Suppose that a square region 21, the area of which is equivalent to the total cell area of a net having a fan-out of fn, extends to a region 23 indicated by broken line, within the range of a square region 22, the area of which is equivalent to a sum of the areas of all cells belonging in an estimation-target block. Further suppose that the wire length extends with the expansion of this region.

The ratio of expansion, EL, can be given by:

$$EL=(n\cdot Sfa(fn)^{1/2}+Ss^{1/2})/((n+1)Sfa(fn)^{1/2}), \qquad (4)$$

where n is the expansion coefficient (see FIG. 5). Sfa(fn) is the total cell area of a net having a fan-out of fn, and Ss is the sum of the areas of cells belonging in a block which is a target of estimation. Sfa(fn) can be given by:

$$Sfa(fn)=Sfu(fn)\cdot(fn+1)\cdot N(fn), \qquad (5)$$

where N(fn) is the number of nets having a fan-out of fn.

If n (the expansion coefficient)=1, then the wire length, Ld(fn), can be given by the following formula.

$$\begin{aligned} Ld(fn) &= Lm(fn)\cdot EL \\ &= Lm(fn)\cdot (Sfa(fn)^{1/2}+Ss^{1/2})/(2Sfa(fn)^{1/2}) \end{aligned} \qquad (6)$$

The square root of a sum of the areas of cells belonging in a net having a fan-out of fn, i.e., $Sfa(fn)^{1/2}$, is equivalent to the length of one of the sides of the square region 21 shown in FIG. 5. Additionally, the square root of a sum of the areas of cells belonging in a netlist, i.e., $Ss^{1/2}$, is equivalent to the length of one of the sides of the square region 22, i.e., the maximum region that the square region 21 can expand. Accordingly, the formula (4) is an equivalence to finding a placement region expansion ratio from the perimeter of the maximum placement region as well as from the perimeter of the minimum placement region, for a net having a fan-out of fn. The wire length Ld(fn), which can be obtained by the formula (6), becomes one obtained by correcting the basic wire length Lm(fn), which is the shortest wire length, taking cell expansion into account.

The net expansion ratio, EL, can be found from a sum of the areas of all cells belonging in an estimation-target block and a sum of the areas of cells belonging in a net having a fan-out in question. In other words, the easiness of cell expansion is determined according to the ratio of a sum of the areas of cells in a net having each fan-out to the placement area of the entire block.

STEP S32

In the step S32, net wire length is corrected taking into account an overlap of wires due to the distribution of cell terminals.

In a net having a great fan-out, or in a net having many terminals, wire overlapping occurs both in the X-coordinate direction and in the Y-coordinate direction due to cell terminal distribution. However, in the model used in the basic wire length determining step S2, no consideration is given to such wire overlapping. It is therefore impossible to represent a wire length including a wire overlapping portion with the half-perimeter of BBOX.

Figure 6A:
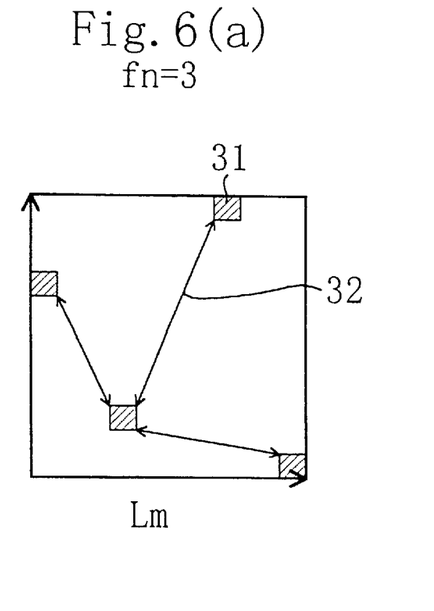
FIG. 6(a) shows a case when the fan-out is small and FIG. 6(b) shows a case when the fan-out is great.
Figure 6B:
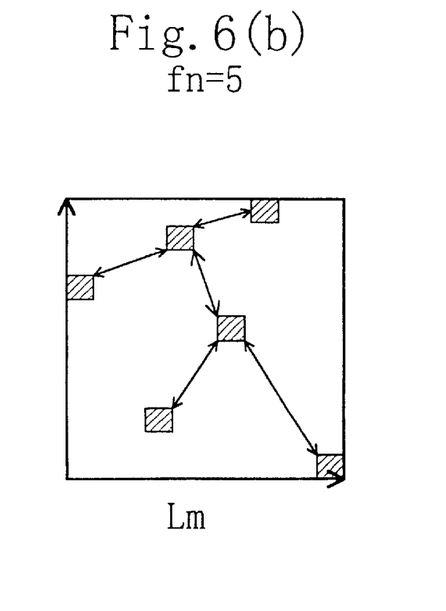

As the fan-out increases, the existence ratio of terminal per unit area likewise increases. It is expected that the length of a wire necessary for establishing a connection between terminals is reduced averagely, FIG. 6, comprised of FIG. 6(a) and FIG. 6(b), schematically shows a relationship between the distribution of terminals and the distance defined between terminals. FIG. 6(a) shows a case when the fan-out fn is small (fn=3). FIG. 6(b) shows a case when the fan-out fn is great (fn=5). In FIG. 6, 31 is a terminal and 32 is a distance between terminals to be connected together. As shown in FIG. 6, a net having a fan-out of fn involves (fn+1) terminals. In FIG. 6(a), four terminals 31 are provided. In FIG. 6(b), six terminals 31 are provided. As can be seen from FIG. 6, when the area of region is fixed and the fan-out is increased, the distance 32 is shortened as the number of terminals 31 is increased.

Meanwhile, as the fan-out increases, the possibility that wire overlapping occurs both in the X-coordinate direction and in the Y-coordinate direction becomes high. However, the length of overlapping portion is reduced and it can be considered such that increase in the wire length is gradually reduced as the fan-out increases.

Suppose here that the distance 32 exponentially decreases as the fan-out increases. The corrected wire length, Lw(fn), may be given by:

$$Lw(fn) = Ld(fn) \cdot (1 + r + r^2 + r^3 + \ldots + r^{fn}) \qquad (7)$$
$$= Ld(fn) \cdot (1 - r^{fn}) / (1 - r),$$

where r is the decreasing coefficient of the distance 31, the number r being a constant less than one. It can be said that the formula (7) is a wire length correction formula expressing an increase in the wire length due to a cell terminal distribution with geometric series.

It has been known that the value of the decreasing coefficient r depends on the regularity of a circuit that is a target of estimation. The experiments we carried out show that the setting that the coefficient r has a value near zero for the case of regular circuits such as data paths and the setting that the coefficient r has a value near 0.5 result in improving the degree of estimation accuracy.

Figure 7A:
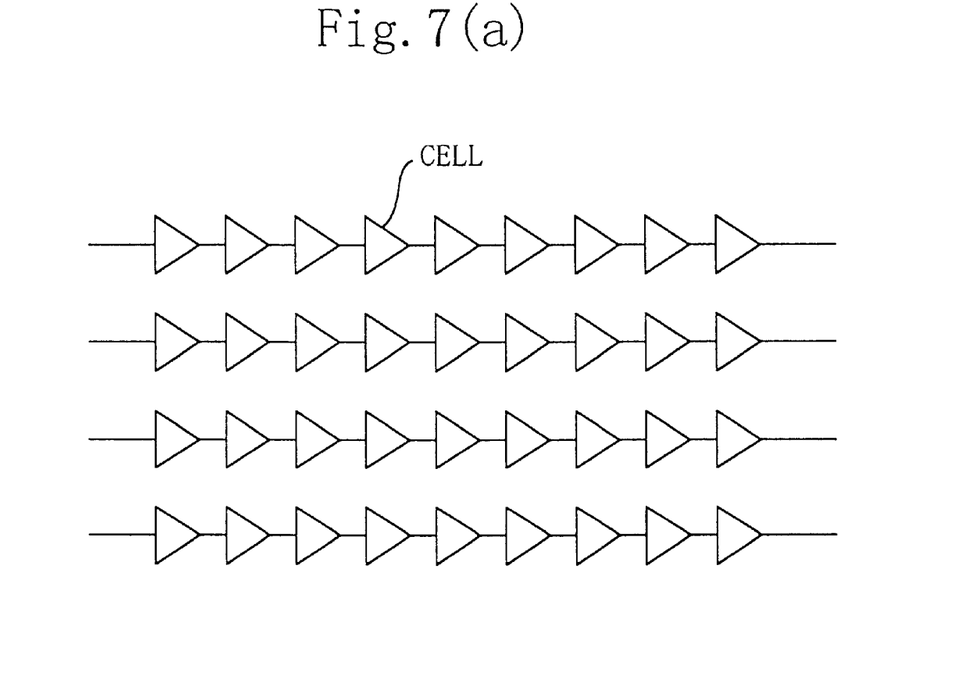
FIG. 7(a) shows a benchmark circuit having a fan-out of 1 and FIG. 7(b) shows a benchmark circuit having a fan-out of 2.
Figure 7B:
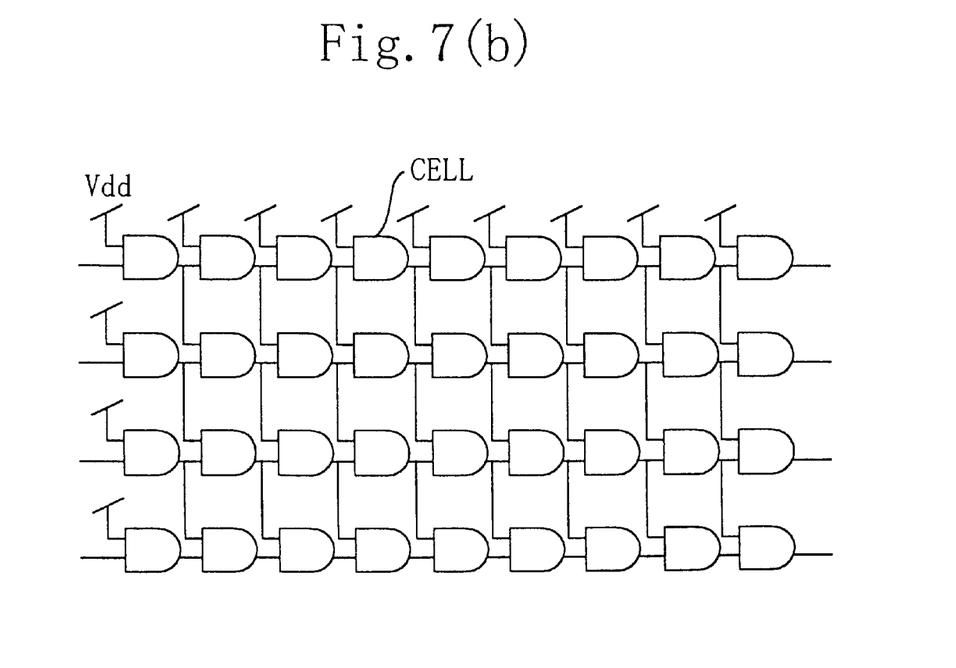

Additionally, a wire length, found in the steps S2, S31, and S32, may be multiplied by an adjustment parameter that depends upon a layout system used. The value of such an adjustment parameter can be determined by the provision of a benchmark circuit of FIG. 7 to a layout system to be evaluated. FIG. 7 shows the organizations of benchmark circuits with a constant fan-out used to easily determine a wire length adjustment parameter. FIG. 7(a) shows a benchmark circuit having a fan-out of 1 (fn=1) and FIG. 7(b) shows a benchmark circuit having a fan-out of 2 (fn=2).

The order in which the steps S31 and S32 are carried out may be changed. That is, in the formula (7) the basic wire length Lm(fn) is multiplied by a correction term instead of the wire length Ld(fn) so as to find the wire length Lw(fn) and thereafter the expansion ratio EL is multiplied by the wire length Lw(fn) so as to find the wire length Ld(fn).

STEP S33

In the step S33, net wire lengths, estimated in the foregoing steps, are corrected taking into account a block aspect ratio.

In the foregoing steps, the BBOX is in the form of a square. However, blocks may take a different form in actual layouts. In actual layouts, it is rare that a chip is formed of only square blocks (the aspect ratio=1).

Further, it is proved from a rule of thumb that as the aspect ratio of a block changes the area and wire length of the block likewise change. If the form of a block is varied while keeping its area constant, the half-perimeter of the block changes according to such a variation in the form. From this, it can be predicted that the wire length depends upon the block form.

Accordingly, suppose here that the BBOX aspect ratio changes with the block aspect ratio and that the wire length also changes with the aspect ratio. Further, it is supposed here that the relative locations of cells will not change when there is made a change in the aspect ratio.

Figure 8A:
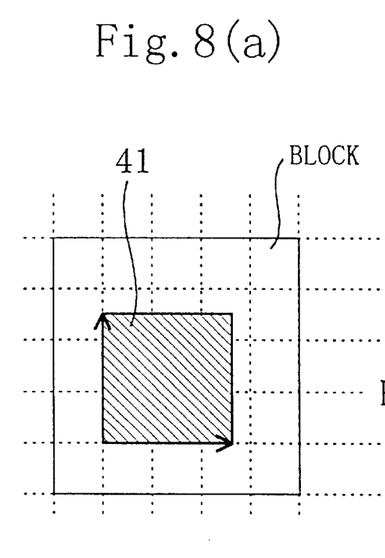
FIG. 8(a) shows a case when the form of a block is square and FIG. 8(b) shows a case when the form of a block is rectangular.
Figure 8B:
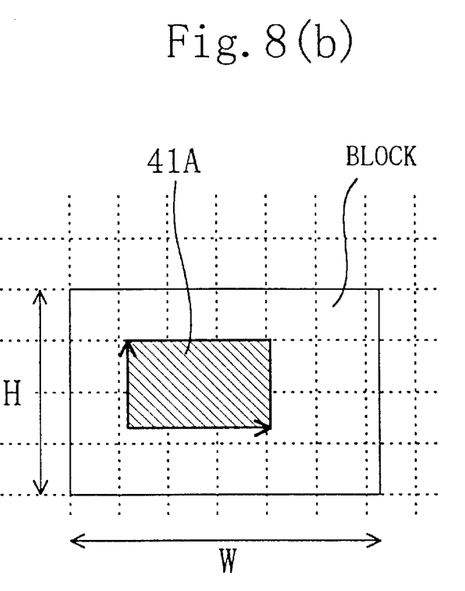

FIG. 8 is a diagram showing variations in the BBOX aspect ratio depending on the block aspect ratio. FIG. 8(a) is for the case of a square block. FIG. 8(b) is for the case of a rectangular block. The blocks, shown in FIGS. 8(a) and 8(b), have the same area. In FIG. 8, 41 is a square BBOX (the aspect ratio=1), 41A is a rectangular block as a result of a change in the block form.

In FIG. 8, As is the aspect ratio, W is the width, and H is the height, in other words As is the ratio of the layout region (block) width W to the layout region (block) height H. Accordingly, the aspect ratio As is given by:

$$As = W/H \qquad (8)$$

If the perimeter of the block shown in FIG. 8(a) is L0 and the perimeter of the block shown in FIG. 8(b) is L1, then following are given.

$$L0 = 4 \cdot \sqrt{(W \cdot H)}$$
$$L1 = 2 \cdot (W + H)$$

Accordingly, the following is given:

$$L1/L0 = 2(W + H)/4 \cdot \sqrt{(W \cdot H)} \qquad (9)$$
$$= (\sqrt{(W/H)} + \sqrt{(H/W)})/2$$
$$= (\sqrt{As} + 1/\sqrt{As})/2.$$

Here, the wire length of the BBOX 41 is Lw(fn) and the wire length of the BBOX 41A is Lwa(fn), and since the wire length varies according to the block perimeter, based on the formula (9) the following formula can be obtained by means of square root generalization.

$$Lwa(fn) = Lw(fn) \cdot (As^{\alpha} + As^{-\alpha})/2 \quad (10)$$

The power product a is determined, from various circuit experiments, to be a parameter. The reason is that since layout tools employ different layout algorithms the influence the block aspect ratio exerts on the wire length differs, tool by tool. Accordingly, the power product $\alpha$ is given as adjustment parameter. The use of the formula (10) makes it possible to provide high-accuracy wire length estimation which reflects the effect of the aspect ratio As. For example, by providing a wire length estimated in the step S32 to the wire length Lw(fn) of the formula (10), it becomes possible to make a correction in consideration of the block aspect ratio.

The wire length correcting method which takes into account the aspect ratio in accordance with the step S33, is applicable not only in the wire length estimating method of the present embodiment, it is applicable also in other wire length estimating techniques. When the aspect ratio is known, any wire length, obtained by a wire length estimating method known in the art, can be corrected according to the formula (10).

Finally, in the step S4 the total wire length of the estimation-target block is found from the wire lengths of the nets obtained in the steps prior to the step S4.

SECOND EMBODIMENT

A second embodiment of the present invention is now described. The second embodiment is for multilayer wiring and relates to a method for estimating a layout area based on a wire length estimated.

Figure 9:
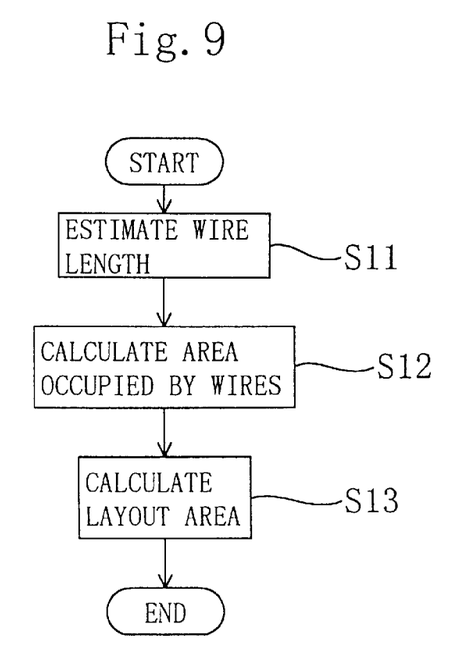
FIG. 9 is a flowchart of the successive steps in an area estimating method in accordance with a second embodiment of the present invention.

FIG. 9 is a flowchart showing the steps of a layout area estimating method in accordance with the second embodiment of the present invention. In the wire length estimating step S11, the wire length L is estimated. In this wire length estimating step S11, the wire length L is estimated according to the wire length estimating method of the first embodiment. In the wire area estimating step S12, the area Sw, i.e., the area occupied by wiring, is found from the wire length L estimated in the wire length estimating step S11. More specifically, the area Sw is found by multiplying the wire length L and the occupied area Uw per unit length. The occupied area Uw is determined taking into account wire width, wire spacing, wire density, and the like.

Next, in the layout area estimating step S13, based on the area Sw found in the wire area estimating step S12, the layout area Se is estimated taking into account the cell total area Ss and the over-the-cell wiring utilization area So.

A layout is formed of a cell area, a wiring area, and a dead area. On the other hand, for the case of multilayer wiring, over-the-cell areas can be used as wiring area. Since the cell area absorbs the wiring area when the area Sw is smaller than the area So, it is arranged such that the area Sw does not reflect the layout area Se. On the other hand, when the area Sw is greater than the area So, the difference between Sw and So is added to the area Ss and the sum becomes the area Se. That is, the layout area Se is estimated by the following formula:

$$Se = Ss + (Sw - So)\theta(Sw - So) \quad (11)$$

Note that Sw=L×Uw.

$\theta(x)$ is the step function. If $x \geq 0$, then $\theta(x)=1$. If $x<0$, then $\theta(x)=0$. Additionally, the second term of the formula (11) may be multiplied by an adjustment parameter which takes into account the influence of dead space.

For the case of multilayer wiring (three or more layer wiring), the area So can be found by summing the over-the-cell wiring utilization areas of cells. On the other hand, for the case of two-layer wiring, Sw>So, for the area So is almost zero. If So=0 is substituted into the equation (11), then:

$$Se = Ss + Sw \quad (12)$$

It is obvious from a rule of thumb that the formula (12) and a layout result by two-layer wiring agree with each other.

In the present embodiment, in the wire length estimating step S11, the wire length L is estimated using the wire length estimating method of the first embodiment. The wire length L may be estimated with the aid of a different wire length estimating method.

ESTIMATION ACCURACY EVALUATION EXPERIMENT RESULTS

With respect to actual chip circuits, comparison between estimated results found by the wire length estimating method and the area estimating method of the present invention and results obtained by actually performing layout processes, was made. A layout tool was used which is commercially available. As a cell library, a 0.35-$\mu$m standard cell library MN7C series, developed by Matsushita Electronics Corporation, was used.

Figure 10:
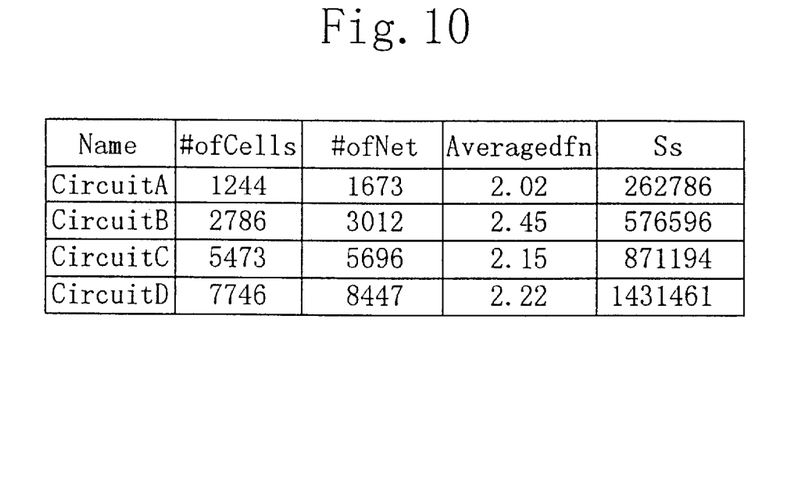
FIG. 10 is a diagram showing the specifications of circuits subjected to estimation accuracy evaluating experiments.
Figure 11:
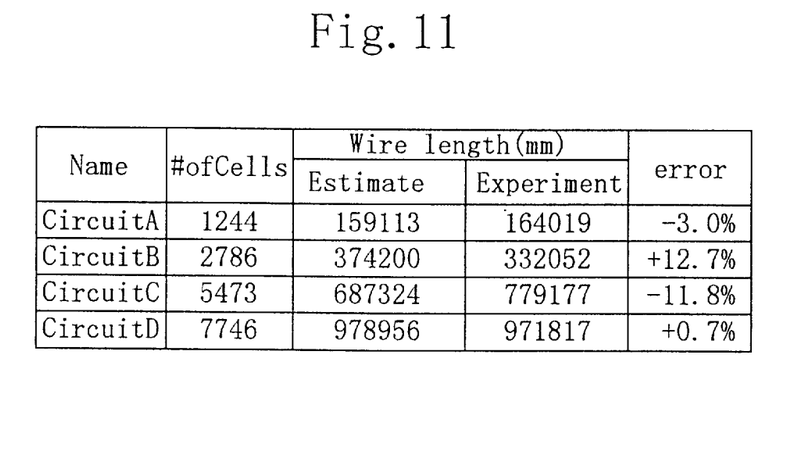
FIG. 11 is a diagram comparing wire lengths obtained from layout results and estimations of wire lengths formed by the wire length estimating method of the present invention, for the circuits shown in FIG. 10.
Figure 12:
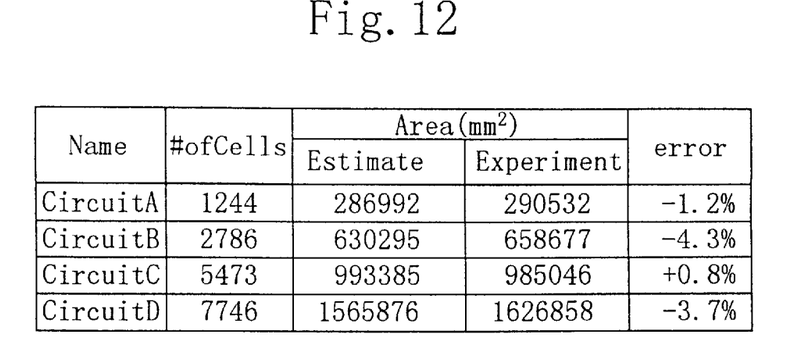
FIG. 12 is a diagram comparing layout areas obtained from layout results and estimations of layout areas formed by the area estimating method of the present invention, for the circuits shown in FIG. 10

FIG. 10 shows the specifications of target circuits. As shown in FIG. 10, as target circuit, four types of circuits differing in the number of cells from one another, were used. FIG. 11 is a diagram comparing a wire length found from a layout result and a wire length estimated by the wire length estimating method of the present invention, for each circuit shown in FIG. 10. FIG. 12 is a diagram comparing a layout area obtained from a layout result and a layout area estimated by the area estimating method of the present invention, for each circuit shown in FIG. 10.

FIG. 11 shows that the wire length can be estimated at an accuracy of about 7%, on the average, and 12.7% at most. FIG. 12 shows that the layout area can be estimated at an accuracy of about 3%, on the average, and 4.3% at most. The degrees of estimation achieved by the estimating methods of the present invention are sufficient to be used in floor plan and logical design.

We claim:

1. A method of estimating the wire length of a large-scale integrated circuit (LSI) from a netlist describing connection information of said LSI and a cell library storing information as to cells used in the LSI design without performing rough placement and rough wiring by a layout system, said method comprising:

(a) an information extracting step of extracting, from said netlist and said cell library, information including the total number of nets, the number of nets for each fan-out, and the types and areas of cells belonging in each net, for an estimation-target block in said LSI;

(b) a basic wire length determining step of determining, based on said information extracted in said information extracting step, a net basic wire length for each fan-out as a reference to wire length estimation; and (c) a net wire length estimating step of estimating, based on said information extracted in said information extracting step, a net wire length for each fan-out by making reference to said net basic wire length for said fan-out determined in said basic wire length determining step and taking into account net expansion due to the distribution of cells in a cell placement;

wherein, without performing cell placement and routing, the total wire length of said estimation-target block is estimated based on said estimated net wire lengths.

2. The wire length estimating method according to claim 1, wherein said basic wire length determining step includes obtaining the average area of cells belonging in all nets having each fan-out and determining a net basic wire length for each fan-out based on the half-perimeter of a square having an area equivalent to the product of said obtained cell average area for said fan-out and the number of cells belonging in a net having said fan-out.

3. The wire length estimating method according to claim 1, wherein said basic wire length determining step includes obtaining the average area of all cells belonging in said estimation-target block and determining a net basic wire length for each fan-out based on the half-perimeter of a square having an area equivalent to the product of said obtained cell average area of said estimation-target block and the number of cells belonging in a net having said fan-out.

4. The wire length estimating method according to claim 1, wherein said net wire length estimating step includes obtaining the expansion ratio of a net having said fan-out from the sum of the areas of all cells belonging in said estimation-target block and the sum of the areas of cells belonging in all nets having said fan-out and estimating a net wire length for said fan-out using said obtained net expansion ratio.

5. The wire length estimating method according to claim 1 wherein said net wire length estimating step includes correcting a net wire length by making use of a correction formula expressing a wire length increment due to the distribution of cell terminals with a geometric series.

6. The wire length estimating method according to claim 1, wherein said net wire length estimating step includes correcting a net wire length by taking into account a variation in wire length according to the aspect ratio of said estimation-target block.

7. A method of estimating the area of a large-scale integrated circuit (LSI) from a netlist describing connection information of said LSI and a cell library storing information as to cells used in the LSI design without performing rough placement and rough wiring by a layout system, said method comprising:

(a) a wire length estimating step of estimating the wire length of an estimation-target block in said LSI;

(b) a wiring area estimating step of estimating, from said wire length estimated in said wire length estimating step, a wiring area of a layout occupied by wires; and (c) a layout area estimating step of estimating, from said wiring area found in said wiring area estimating step and the total cell area and over-the-cell wiring utilization area of said estimation-target block, the layout area of said estimation-target block;

wherein, without performing cell placement and routing, said layout area estimating step determines said total cell area to be the layout area of said estimation-target block when said wiring area is smaller than said over-the-cell wiring utilization area and obtains, when said wiring area is greater than said over-the-cell wiring utilization area, said estimation-target block's layout area from a difference between said wiring area and said over-the-cell wiring utilization area and from said total cell area.

8. The LSI area estimating method according to claim 7, said wire length estimating step including:

(a) an information extracting step of extracting, from said netlist and said cell library, information including the total number of nets, the number of nets for each fan-out, and the types and areas of cells belonging in each net, for said estimation-target block;

(b) a basic wire length determining step of determining, based on said information extracted in said information extracting step, a basic wire length for each fan-out as a reference to wire length estimation; and (c) a net wire length estimating step of estimating, based on said information extracted in said information extracting step, a net wire length for each fan-out by making reference to said net basic wire length for said fan-out determined in said basic wire length determining step and taking into account net expansion due to the distribution of cells in a cell placement;

wherein the total wire length of said estimation-target block is estimated based on said estimated net wire lengths.

9. The LSI area estimating method according to claim 8, wherein said net wire length estimating step includes obtaining the expansion ratio of a net having said fan-out from the sum of the areas of all cells belonging in said estimation-target block and the sum of the areas of cells belonging in all nets having said fan-out and estimating a net wire length for said fan-out using said obtained net expansion ratio.

* * * * *